United States Patent
Hulbert

(10) Patent No.: US 8,421,460 B2
(45) Date of Patent: *Apr. 16, 2013

(54) UPCONVERTER

(75) Inventor: Anthony Peter Hulbert, Southampton (GB)

(73) Assignee: Siemens Aktiengesellschaft, Munich (DE)

( * ) Notice: Subject to any disclaimer, the term of this patent is extended or adjusted under 35 U.S.C. 154(b) by 451 days.

This patent is subject to a terminal disclaimer.

(21) Appl. No.: 12/726,741

(22) Filed: Mar. 18, 2010

(65) Prior Publication Data

US 2010/0253346 A1    Oct. 7, 2010

(30) Foreign Application Priority Data

Apr. 3, 2009  (GB) .................................. 0905752.2
Sep. 8, 2009  (GB) .................................. 0915648.0

(51) Int. Cl.
*G01V 3/00*   (2006.01)
*G01R 33/20*  (2006.01)

(52) U.S. Cl.
USPC ............ 324/316; 324/318; 324/322; 330/165

(58) Field of Classification Search ........... 324/300–322
See application file for complete search history.

(56) References Cited

U.S. PATENT DOCUMENTS

| | | | |
|---|---|---|---|
| 3,611,110 A | 10/1971 | Corbey | |
| 3,824,482 A | 7/1974 | Whelehan, Jr. | |
| 4,387,470 A | 6/1983 | Maurer et al. | |
| 5,245,288 A | 9/1993 | Leussler | |
| 5,384,536 A | 1/1995 | Murakami et al. | |
| 6,906,520 B2 | 6/2005 | Heid et al. | |
| 7,123,009 B1 | 10/2006 | Scott | |
| 7,123,090 B2 | 10/2006 | Ratzel | |
| 7,323,876 B2 | 1/2008 | Den Boef | |
| 7,417,433 B2 | 8/2008 | Heid et al. | |
| 7,622,928 B2 | 11/2009 | Gauss et al. | |
| 7,701,220 B2 | 4/2010 | Ehnholm | |

(Continued)

FOREIGN PATENT DOCUMENTS

DE  103 04 861 A1   8/2004
GB  1132545         11/1968

OTHER PUBLICATIONS

U.S. Appl. No. 12/874,706, filed Sep. 2, 2010.
U.S. Appl. No. 12/726,567, filed Mar. 18, 2010.
U.S. Appl. No. 12/753,159, filed Apr. 2, 2010.
U.S. Appl. No. 12/753,150, filed Apr. 2, 2010.
U.S. Appl. No. 12/753,134, filed Apr. 2, 2010.
U.S. Appl. No. 12/753,148, filed Apr. 2, 2010.
U.S. Appl. No. 12/753,138, filed Apr. 2, 2010.
"Behavioral Modeling and Simulation of a Parametric Power Amplifier," Gray et al., IMS (2009) pp. 1373-1376.

*Primary Examiner* — Vincent Q Nguyen
*Assistant Examiner* — Emily Chan
(74) *Attorney, Agent, or Firm* — Schiff Hardin LLP

(57) ABSTRACT

An upconverter has a two port parametric amplifier that has a first port to receive an input signal to be amplified and upconverted and a second port to receive a local oscillator signal and to output the amplified, upconverted signal at upper and lower sideband frequencies. The upconverter further has an antenna coupled to the second port to receive the local oscillator signal and transmit the amplified, upconverted signal at upper and lower sideband frequencies and a low noise amplifier at the first port of the parametric amplifier, which is powered by the local oscillator signal.

9 Claims, 6 Drawing Sheets

U.S. PATENT DOCUMENTS

| | | |
|---|---|---|
| 7,750,630 B2 | 7/2010 | Van Helvoort et al. |
| 7,750,635 B2 | 7/2010 | Van Helvoort et al. |
| 7,777,492 B2 | 8/2010 | Vernickel et al. |
| 2003/0206019 A1 | 11/2003 | Boskamp |
| 2007/0013376 A1 | 1/2007 | Heid et al. |
| 2007/0188175 A1 | 8/2007 | Burdick, Jr. et al. |
| 2007/0207763 A1 | 9/2007 | Bollenbeck et al. |
| 2008/0143459 A1 | 6/2008 | Vernickel et al. |
| 2008/0157769 A1 | 7/2008 | Renz et al. |
| 2008/0246477 A1 | 10/2008 | Nakabayashi |
| 2009/0286478 A1 | 11/2009 | Biber et al. |
| 2010/0117651 A1* | 5/2010 | Evans .......................... 324/322 |

* cited by examiner

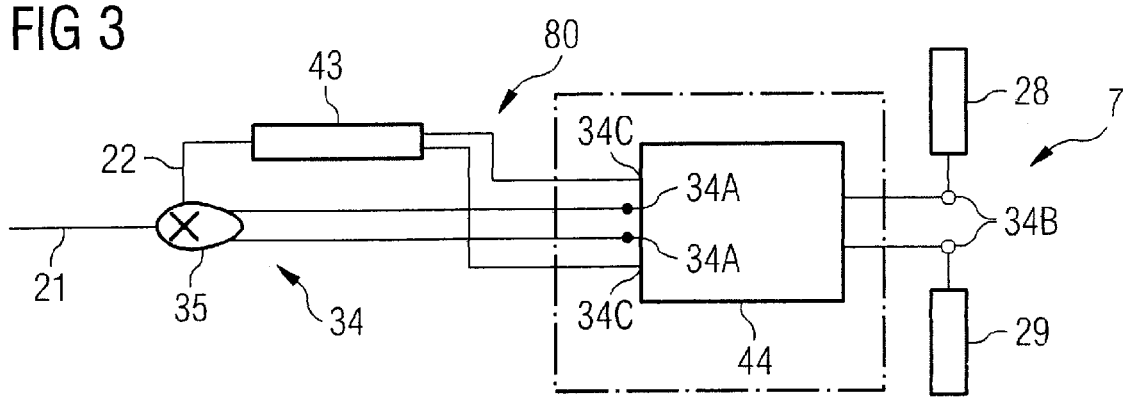
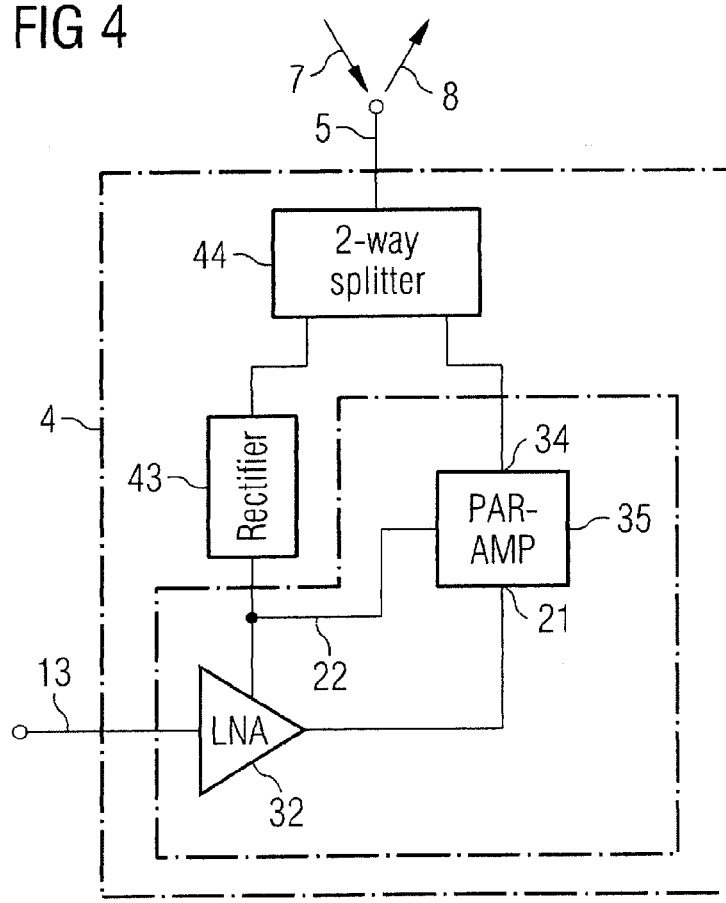

UPCONVERTER

BACKGROUND OF THE INVENTION

1. Field of the Invention

This invention relates to an upconverter using a two port parametric amplifier, in particular for use in magnetic resonance imaging (MRI) systems.

2. Description of the Prior Art and Related Subject Matter

MRI scanners use a combination of a strong constant magnetic field (B0) from a superconducting magnet that is modified by gradient fields generated by gradient coils, together with a rotating magnetic field (B1) from a radio frequency (RF) antenna to excite nuclear magnetic resonances in the body that generate short term RF signals that are received to build up a tomographic image.

All current-generation MRI scanners employ arrays of local coils mounted in close proximity to the scanned patient to receive the RF with maximum possible signal to noise ratio (SNR). The local coils that receive signals from the back of the patient are mounted in the patient table. Local coils that receive signals from the front of the patient are arranged into 'mats' that are carefully placed over the patient. Associated with each mat is a flexible cable typically containing one co-axial line for each local coil. The cables interact with the B1 field and with the signals generated from the patient so 'traps' (high impedance sections) must be included at regular (typically λ/8) intervals. These add cost and inconvenience to the structure. In use, the requirement to connect the cables and sterilize them between scanning one patient and the next leads to down-time between scans. Elimination of these cables is therefore desirable.

In co-pending UK patent application no. 0903722.7, corresponding to U.S. Ser. No. 12/612,831 filed Nov. 5, 2009, a wireless MRI system is described in which an array of antennas lining the MRI scanner bore is arranged to transmit a local oscillator (LO) signal that is received by antennas on the patient mat and fed therefrom to upconverters which upconvert magnetic resonance signals received from local coils in the patient mat and re-radiate them from the same antenna to be received at one or more of the bore array antennas for downconversion and processing to generate an MRI image. However, wireless implementations give rise to new problems. When using a two port parametric amplifier in a wireless implementation, it is desirable that the parametric amplifier is entirely powered by an incident local oscillator signal at a microwave frequency.

SUMMARY OF THE INVENTION

In accordance with a first aspect of the present invention, an upconverter has a two port parametric amplifier, the amplifier having a first port to receive an input signal to be amplified and upconverted and a second port to receive a local oscillator signal and to output the amplified, upconverted signal at upper and lower sideband frequencies; wherein the upconverter further comprises an antenna coupled to the second port to receive the local oscillator signal and transmit the amplified, upconverted signal at upper and lower sideband frequencies. The upconverter further has a low noise amplifier at the first port of the parametric amplifier, and the upconverter further has a power harvester. The power harvester receives local oscillator power and generates a DC bias voltage for the parametric amplifier and a supply for the low noise amplifier.

The self powered parametric amplifier is improved by the addition of the, low noise amplifier. The local oscillator signal received at the antenna provides a source of power for both the parametric amplifier and the low noise amplifier. The low noise amplifier reduces the gain required in the parametric amplifier, improving stability and also provides isolation between a local coil from which an input is received, reducing variations in RF impedance seen by the parametric amplifier at the first port.

Preferably, the upconverter further has a power splitter between the antenna and the parametric amplifier; wherein the power splitter splits incident local oscillator power between the power harvester and the parametric amplifier.

Preferably, the power splitter has one of a directional coupler and a Wilkinson coupler.

Preferably, the first port is an RF port, which receives signals in the frequency range 20 MHz to 500 MHz.

Preferably, the second port is a microwave port, which receives signals in the frequency range 1 GHz to 5 GHz.

Preferably, the two port parametric amplifier has a pair of varactor diodes connected between the first port and the second port. The diodes are connected in parallel from the first port and in series from the second port. The first port receives an input signal via the low noise amplifier. The second port receives an incident local oscillator signal and outputs an upconverted amplified input signal.

In accordance with a second aspect of the present invention, a wireless magnetic resonance imaging system has a local oscillator and transceiver array mounted in a bore of the system and a wireless local coil array and upconversion stage comprising a plurality of upconverters according to the first aspect.

BRIEF DESCRIPTION OF THE DRAWINGS

FIG. 3 is a block diagram of a parametric amplifier device, incorporating a parametric amplifier according to FIG. 2.

FIG. 4 is a block diagram of an upconverter according to the present invention.

DESCRIPTION OF THE PREFERRED EMBODIMENTS

The wireless concept to which the features of the present invention apply is based on upconversion, in the patient mat, of the RF (Larmor) frequency signals from the patient coils to microwave frequencies for transmission to microwave antennas located on the bore of the scanner. The combination of transmit and receive antennas on the patient and bore respectively constitutes a MIMO (Multiple Input/Multiple Output) system. The greater multiplicity of receive antennas in the bore array allows individual signals from a number of patient antennas to be resolved. The present invention relates to an implementation of the upconversion process.

Figure 1:
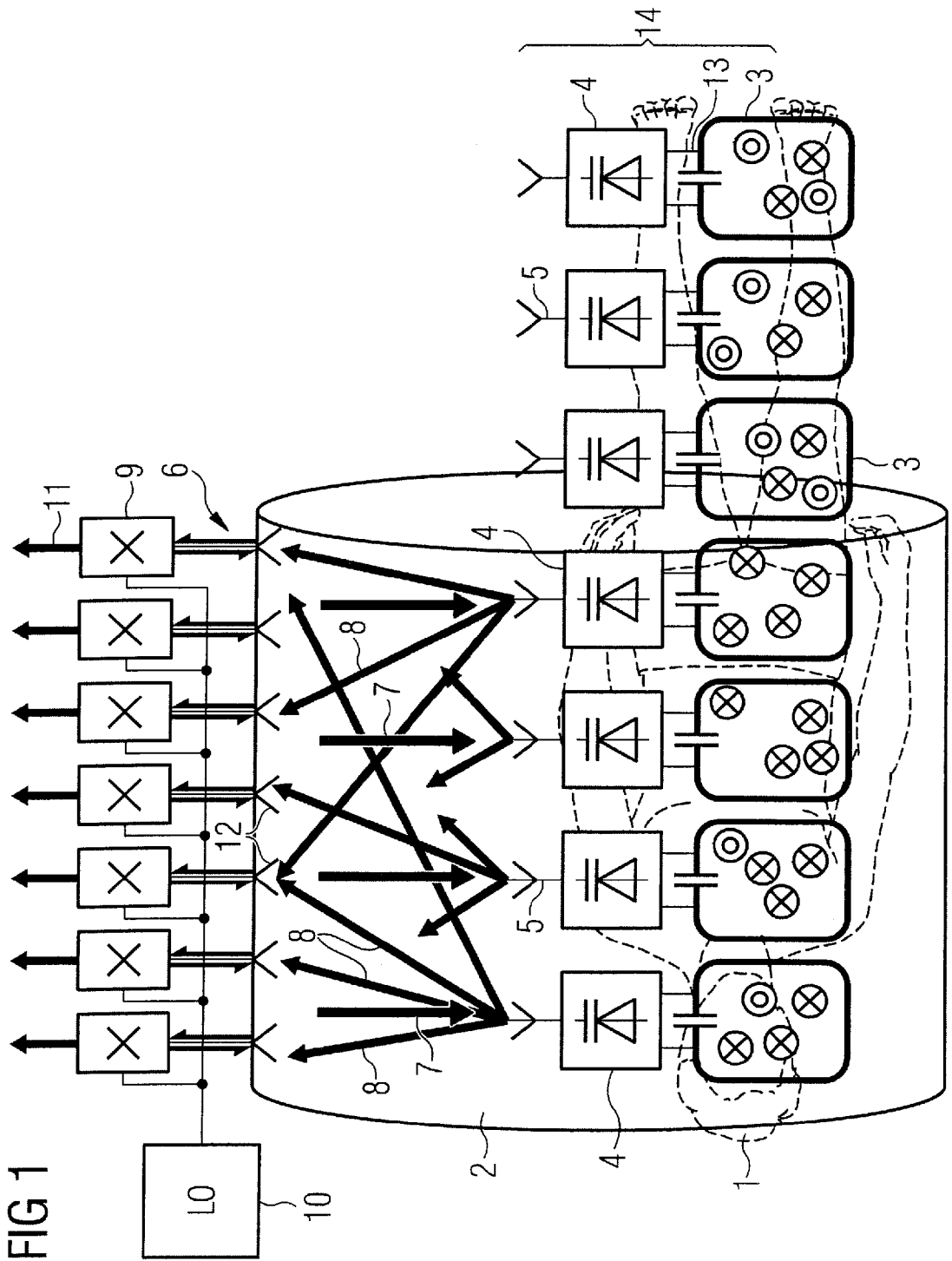
FIG. 1 illustrates an example of an MRI system incorporating upconverters according to the present invention.

An example of an MRI system using a MIMO microwave link, in which amplifiers in accordance with the present invention are used, will now be described. FIG. 1 shows a patient 1 within an MRI scanner bore tube 2. A mat covers the part of the patient for imaging and embedded in the mat are a number of local coils 3. Associated with each local coil 3 is an upconverter stage 4 and microwave antenna 5. Transceivers 9, connected to an array 6 of antennas 12, are integrated into the scanner bore 2. The frequency upconverter 4 for each patient mat coil 3 produces signals for transmission to the array of transceivers in the scanner bore 2. A local oscillator (LO) signal at around 2.4 GHz, or other chosen microwave frequency, feeds the antenna array 6 to illuminate the patient coil electronics 14 with a signal 7 at the local oscillator frequency. Parametric amplifiers in the upconverter stage 4 use the incident local oscillator signal 7 to provide a frequency reference and power for upconversion. Magnetic resonance (MR) signals 13 from the coils are thereby converted to microwave frequency signal 8 and transmitted to the bore transceiver antenna array 6. The same local oscillator signal in the transceivers converts the upconverted signals 8, from the patient coils 3, at the LO frequency ±63 MHz, back to the original MR frequency of 63 MHz for input 11 to MR receivers in an image processing system (not shown.) The Larmor frequency $\omega_0$ is dependent upon the gyromagnetic ratio $\gamma$ and the magnetic field strength B0, so in the case of a 1.5 Tesla magnet, the MR frequency is 63.6 MHz, or for a 3 T magnet, the MR frequency is 123 MHz. These values are commonly used magnet and MR frequencies, but magnets ranging from 0.5 T to 11 T could be used and the MR and local oscillator microwave frequencies may also be chosen from a much wider band. For example, dependent upon the nucleus type, the MR frequencies may range from 20 MHz to 500 MHz and the LO frequency might be chosen in the range of 1 GHz to 5 GHz.

The system uses a parametric amplifier circuit to carry out the mixing and amplification necessary for upconversion 4 of a radio frequency signal 13 received from each of the local coils 3.

Figure 2:
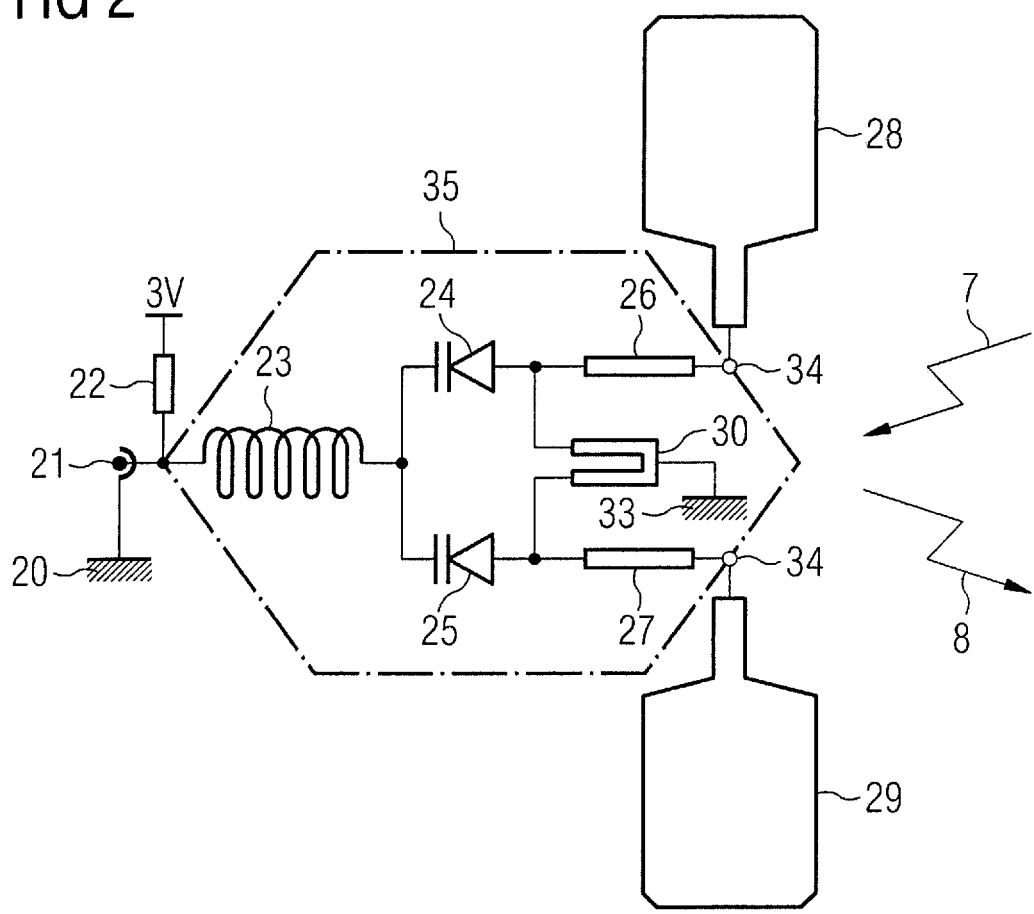
FIG. 2 illustrates in more detail, an example of a parametric amplifier for use in an upconverter in the system of FIG. 1.

An example of the parametric amplifier is shown in more detail in FIG. 2. The example of FIG. 2 has a parametric amplifier core 35 having a single ended RF input 21 to receive the signal 13 from the local coil and an earth 20 at the input and an output port 34 for connection to a dipole antenna 28, 29. In this example, the magnetic resonance signal is at 63.6 MHz. The RF signal 13 is fed via a high Q RF input inductor 23 to drive the varactor diode pair 24, 25 in common mode parallel with 'earth return' via the shunt matching line pair 30 to ground connection 33. A high impedance (very low current requirement) voltage source provides bias voltage 22 at e.g. 3V via the high Q RF input matching choke 23 to the varactor diode pair 24, 25 (e.g. BBY53-02V) to set the correct operational capacitance bias point. Incident local oscillator 'pump' signal 7 (at a frequency for example of 2.44 GHz) received by the microwave antenna 28, 29 is fed via the appropriate printed microwave series matching lines 26, 27 and shunt matching lines 30 to provide differential drive (with centre ground 33) to the varactor diode pair 24, 25. This differential LO signal 7 mixes with the common mode RF drive signal 13 in the varactor diodes 24, 25 to produce microwave frequency lower side band (LSB) and upper side band (USB) products. These differential mode mixing products are fed back through the microwave matching lines 26, 27 to the microwave antenna 28, 29 for transmission back to the bore array of transceivers.

The two varactor diodes 24, 25 of the parametric amplifier circuit serve as an upconverter and an amplifier that requires no DC power supply, using directly the 'pump' signal 7 as a local oscillator and source of power. Parametric amplifiers are typically two port devices where a first port receives an input signal at a relatively low frequency to be upconverted and amplified and a second port both receives the pump signal at a relatively high frequency and outputs the relatively high frequency upconverted and amplified mixing product. Circulators are commonly used to separate the upconverted output signals from the incident LO drive signals, but these ferromagnetic based devices are not suitable for MRI applications because of the B0 field. Instead, re-radiated LSB/USB signals are separated from the incident LO in filters in the bore transceivers.

For the example, it is desirable that the pump signal 7 to the parametric amplifier should be received from an over-the-air transmission in order to remove any requirement for a DC power supply to the mat. The total bandwidth occupied by the upper and lower sidebands and the pump signal 7 is typically small enough to fall within the efficient bandwidth of a single antenna. Thus, a two port parametric amplifier circuit, is provided such that the first port 21 receives the input signal 13 to be upconverted and amplified and the second port 34 receives the pump signal 7 and also outputs the upconverted and amplified input signal 8 at the upper and lower sideband frequencies.

The local oscillator signal 7 received by the dipole antenna 28, 29 from the bore array transmitters 9 arrives at the microwave port 34 at a power level of +10 dBm. This "pump" signal is fed via the printed line matching 26, 27 to the varactor diode pair 24, 25. The common cathode configuration of the varactor diodes, with the anodes connected one to each half of the balanced feed from the dipole antenna 28, 29, results in antiphase stimulation of the varactor diodes at the LO (pump) frequency. RF stimulation via the RF input inductor 23 at the common cathode node leads to in-phase stimulation of the varactor diodes 24, 25 at the RF frequency. The resulting LSB and USB signals generated in each of the two varactor diodes are therefore in anti-phase. These wanted output signals, along with the greater (reflected) part of the incident LO signal 7, are then conveyed via the printed line matching 26, 27 back to the dipole antenna 28, 29 where the signals 8 are broadcast into the bore 2 for reception by the bore receiver array system 6, 9, 10.

The high Q RF input matching choke 23 in series with the single ended RF input 21 is series resonant with the high capacitive reactance of the varactor diodes 24, 25 at the RF frequency. The earth return for the RF feed 21 is provided by the centre grounding 33 of the microwave port shunt line. The center-grounded shunt microstrip line in the microwave port resonates with the greater part of the high capacitive admittance of the varactor diodes 24, 25 at the microwave port frequency. The balanced pair of series lines 26, 27 then tunes out the remainder of the capacitive reactance of the varactor diodes and completes the impedance transformation to match to the 22 Ω balanced load of the microwave dipole antenna 28, 29.

In this implementation, the diodes are connected in parallel for the RF feed, to halve the high impedance of the varactor diodes at 63.6 MHz RF for presentation at the RF port. The diodes are connected in series for the microwave port 34 to double the very low impedance of the varactor diodes at 2.442 GHz for presentation at the microwave port. The series/parallel configuration lends itself to single ended RF drive, balanced microwave drive and two port operation. A single ended RF drive is appropriate at 63.6 MHz and is effected by means of drive through the RF input choke 23 and ground return 33 at the microwave port voltage node. A balanced microwave port is appropriate at 2.44 GHz for connection to a dipole antenna.

The microwave port operates fully balanced for LO "pump" feed at 2.442 GHz as well as for the output frequencies at 2.442 GHz±63.6 MHz. This obviates the need for any low impedance grounding in the microwave port circuits. Operation of the microwave port fully balanced suits perfectly connection to the balanced dipole antenna 28, 29 for reception of the LO signal 7 and re-radiation of the LSB and USB signals 8.

The design of this implementation is configured to allow high, in fact potentially infinite, "4-frequency" gain. This is a re-generative condition whereby RF frequency power that is produced in the generation of the LSB signal cancels with incident RF from the signal source to result in a reduced level of absorbed RF power for a given output and hence an increased gain. The correct power balance to achieve a controlled fixed gain is dependent on the precise tuning of the microwave port, which in turn is dependent on the bias voltage applied to the varactor diodes 24, 25, so uses a system for precise control of the bias voltage to achieve this control, and in addition to compensate for the dependence of the microwave port tuning on LO drive level In summary, local coil upconverters based on parametric amplifiers perform the upconversion of the local coil signals from the Larmor frequency to microwave frequencies, implementing low noise frequency conversion and amplification in simple, low cost circuitry. The parametric amplifiers use the incident local oscillator signal 7 to provide the frequency reference and the power for the upconversion. MR signals 13 from the coils are thereby converted to microwave frequency and transmitted to the bore transceiver antenna array 6.

The parametric amplifier described above may suffer from certain problems. There can be difficulties in maintaining stability at the high gain desired of about 25 dB; and in achieving the required very low noise figure of the order of 0.5 dB. The parametric amplifier is sensitive in terms of gain and stability, to variations in the RF frequency source impedance and may also suffer from poor high signal handling, believed to be caused by strong interactions between parametric amplifier tuned frequency and conversion of local oscillator power into signal power.

The present invention addresses these problems by providing a low noise amplifier at the first, RF port of the parametric amplifier, as illustrated in FIG. 4.

A pick up coil 3 which has been excited by magnetic resonance signals from a patient generates a signal 13 at the Larmor frequency which is input to the upconverter stage 4. The Larmor frequency signal 13 is amplified in a low noise amplifier (LNA) 8 and input to the radio frequency (RF) input 21 of the two port parametric amplifier 35. A radiated local oscillator (LO) signal 7 from the microwave antennas 12 mounted on the bore tube 2 is received at the microwave antenna 5 connected to the microwave frequency port 34 of the parametric amplifier. The RF signal 13 and LO signal 7 produce upper and lower sidebands, still within the bandwidth of the bore tube microwave antenna 12 and one, other, or both of the sidebands are radiated for reception by receivers 9 in the bore which process the signals into magnetic resonance images.

However, one of the key benefits of using a parametric amplifier of the type described above is that it is fully powered by the incident local oscillator signal, so no external DC power source is required. Thus, an addition is the use of power harvesting, whereby the microwave antenna of the upconverter stage provides LO power that is rectified to produce a DC voltage to power the LNA. Furthermore, power harvesting may be used in combination with a power splitter 44. In one example, the input of the power harvester 43 may connect to a two way splitter, which may have symmetry or asymmetry of power splitter powers. The splitter may take the form of a Wilkinson splitter, or directional coupler, to provide isolation between the two split parts of the LO signal.

In this way, the present invention is able to harvest some DC power from the local oscillator to provide the necessary power for the LNA and also a DC bias voltage for the parametric amplifier. This option is illustrated in FIG. 4. One part of the incident LO signal connects to the microwave frequency port 34, which channels local oscillator power and returns upconverted side bands. Another part 80 of the signal is connected to the power harvesting circuit 43 which takes the form of a rectifier and a reservoir circuit, e.g. a capacitor, described in more detail hereinafter, arranged to obtain DC voltage, the circuit having a suitable voltage and current capability to power the low noise amplifier, as well as providing a bias signal to the parametric amplifier. The LNA is designed for very low power consumption and its output circuit is matched directly into the optimum input impedance of the parametric amplifier.

In co-pending UK patent application GB0915655.5 (corresponding to U.S. application with attorney docket number P10,0070 filed simultaneously herewith), the use of a power splitter has been proposed as indicated in FIG. 3. The splitter 44 is connected between the antennas 28, 29 and the parametric amplifier 35. Most of the incident power goes to the parametric amplifier 35. A smaller part is diverted to the rectifier 43 which converts the AC signal 80 into a DC signal by rectification, to provide a bias voltage 22 for the parametric amplifier 35. The splitter 44 presents a minimum loss to signals coming back out to the antenna from the parametric amplifier 35. The return signal does not go out to the rectifier 43, as the splitter provides isolation to prevent this.

Figure 5A:
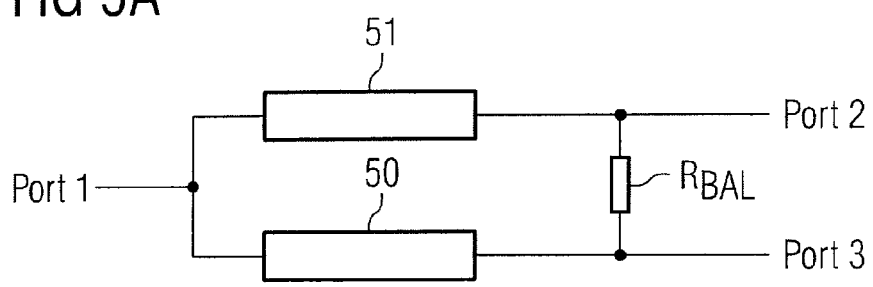
FIG. 5A illustrates a symmetric power splitter.
Figure 5B:
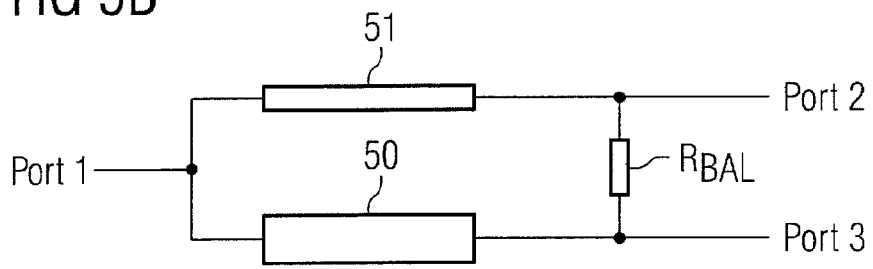
FIG. 5B illustrates an asymmetric power splitter.

Different types of power splitter 44 may be used. FIGS. 5A and 5B show simplified forms illustrating the operation of the power splitter. FIG. 5A illustrates a symmetric Wilkinson splitter. Port P1 sees an impedance of 50 Ω. The signal splits equally through quarter wavelength lines 50, 51 at an impedance of approximately 72 Ω. A balancing resistor (Rbal) at 100 Ω is connected between P2 and P3. This arrangement gives a perfect match at P1, if and only if, P2 and P3 are terminated in 50 Ω. The arrangement presents a perfect match at P2 and P3, if and only if, P1 is terminated. The power incident on P1 is divided to give −3 dB at P2 and P3. FIG. 5B illustrates an asymmetric Wilkinson splitter, having two ¼ wavelength tracks 50, 51 of different width. In these examples, P1 is equivalent to the microwave port 34 and ports P2 and P3 are connections to the parametric amplifier 35 and rectifier 43 respectively.

Figure 6A:
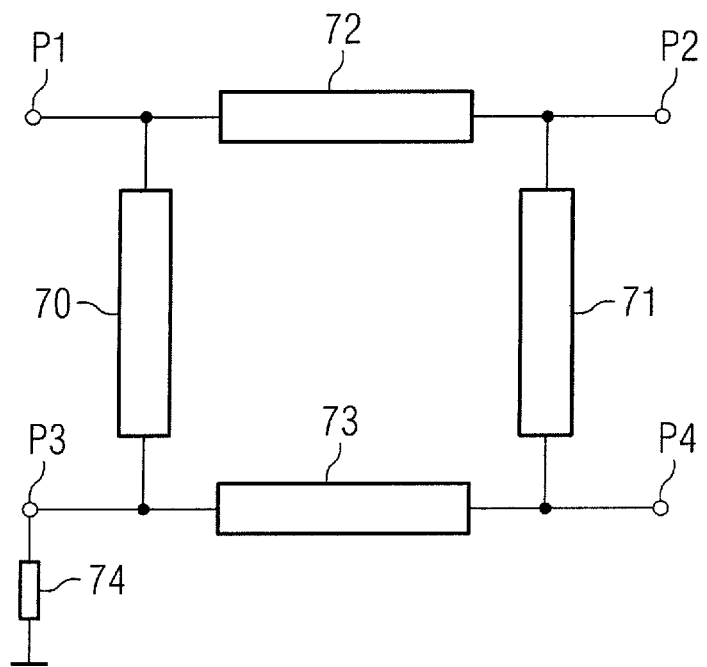
FIG. 6A illustrates a quadrature hybrid branch line splitter.
Figure 6B:
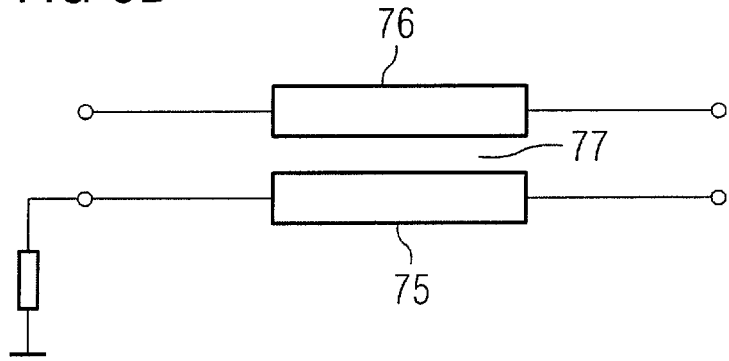
FIG. 6B illustrates an edge coupler.

Usually, power is split equally between P2 and P3, but the requirements of the present invention are for an asymmetric structure, such as shown in FIG. 5b, giving rise to only a small part of the power going to the power harvester 43 and most of the power going to the parametric amplifier 35. Other types of splitter include directional couplers, for example, either branch line or edge couplers. The branch line coupler of FIG. 6a is a quadrature hybrid, where pairs 70, 71; 72, 73 of the same impedance are arranged to get power in at P1, dividing between P2 and P4, but with nothing out at P3, which is connected to ground. These are more difficult to manufacture than Wilkinson couplers and as P3 is surplus to requirements, the couplers are also less compact. The edge coupler of FIG. 6b is made by printing two tracks 75, 76 very close together. This has 4 ports and one is connected to earth via a dump resistor. The required gap 77 between the tracks for MRI applications is too small for existing manufacturing tolerances, as the ratio of track width to thickness of the dielectric determines the necessary spacing.

Figure 7:
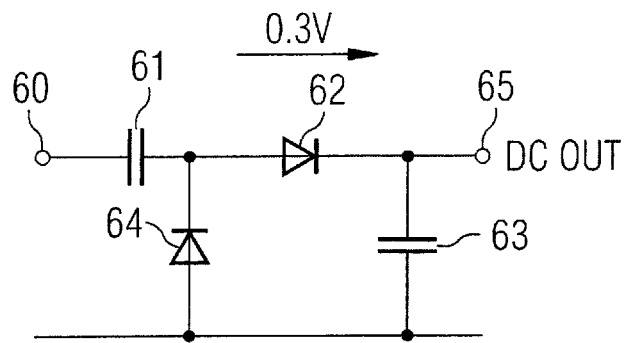
FIG. 7 illustrates a simple rectifier circuit for use as a power harvester in the device of FIG. 3.

The power harvester 43 may incorporate a resonant voltage transformation circuit and/or a Cockcroft-Walton voltage multiplier as necessary to obtain the required output voltage. FIG. 7 illustrates operation of an embodiment of a simple power harvester circuit. An input signal 60 sees a low impedance at RF frequency (e.g. 2.4 GHz) in capacitor 61, which may be a 100 pF capacitor, but this capacitor provides a block at DC. When the voltage goes high, diode 62 starts to conduct, takes current and puts charge onto the upper plate of the other capacitor 63. When the voltage goes low, the first diode 62 is reverse bias and the other diode 64 is forward biased. This restores charge to the first capacitor 61. Over time, the effect is to produce a DC output at 65.

Figure 8:
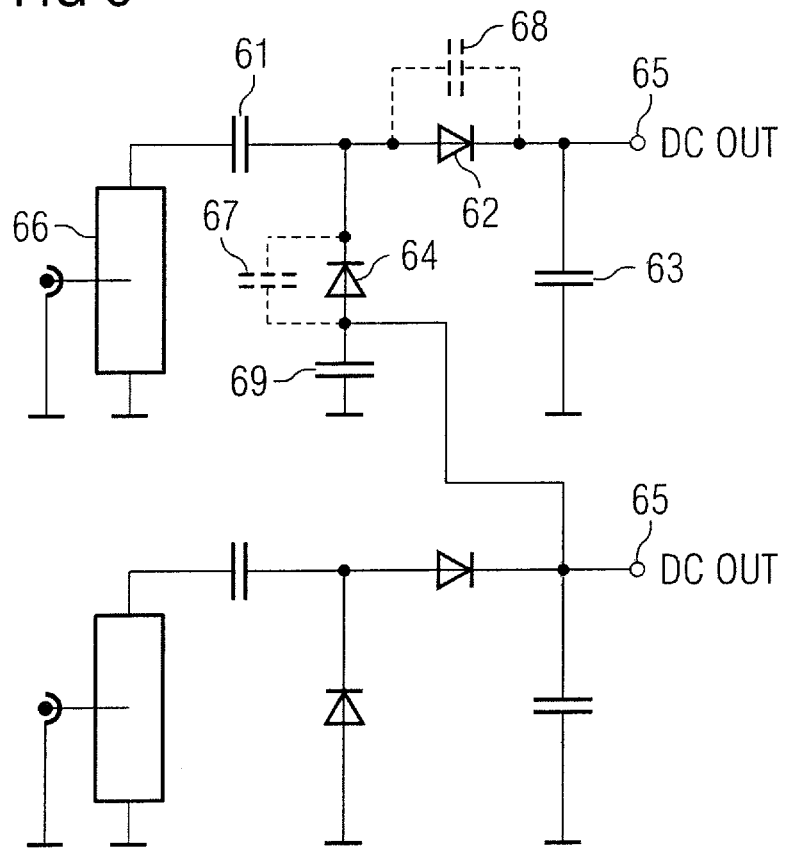
FIG. 8 shows an alternative example of a rectifier circuit for use as a power harvester in the device of FIG. 3.

An alternative implementation is shown in the example of FIG. 8, using a pair of rectifier circuits with a ¼ wavelength line 66. By tapping into the line 66 low down, the line resonates to increase the amplitude of the signal coming out to capacitor 61. Due to parasitic capacitances 67, 68 of the diodes 64, 62, the required line is actually less than ¼ wavelength. The rectifier is tuned to 2.44 GHz and the available voltage is further increased by adding two outputs 65 together, using another capacitor 69 in the middle line, effectively acting as new ground, to get twice the voltage out at the same current.

If there is a direct connection of the power harvester 43 to the splitter output 34C, then current flow through the conducting diode does not start until at least 0.3V above the centre voltage. Impedances in the system mean that this does not give enough voltage to the power harvester. Only the top and bottom of the waveform are sufficient to drive the diodes. However, this problem is addressed by the introduction of the low noise amplifier of the present invention between the local coil and the parametric amplifier. The amplitude of the input waveform is increased, so that more of the total waveform is above the threshold voltage. The required parametric amplifier gain is reduced by the LNA gain, making stability more readily achievable. The LNA can be designed in isolation for very low noise figure and the LNA provides isolation between the local coil and the parametric amplifier, reducing variations in the RF impedance seen by the parametric amplifier. The lower gain parametric amplifier circuit will have lower effective loaded Q, so that detuning effects at high signal level are less marked.

Although modifications and changes may be suggested by those skilled in the art, it is the intention of the inventor to embody within the patent warranted hereon all changes and modifications as reasonably and properly come within the scope of his contribution to the art.

I claim as my invention:

1. An upconverter comprising:
    a two port parametric amplifier, said amplifier comprising a first port to receive an input signal to be amplified and upconverted and a second port to receive a local oscillator signal and to output the amplified, upconverted signal at upper and lower sideband frequencies;
    an antenna coupled to the second port to receive the local oscillator signal and transmit the amplified, upconverted signal at upper and lower sideband frequencies;
    a low noise amplifier at the first port of the parametric amplifier; and
    a power harvester, said power harvester receiving local oscillator power and generates a DC bias voltage for the parametric amplifier and a supply for the low noise amplifier.

2. An upconverter according to claim 1, comprising a power splitter between the antenna and the parametric amplifier; the power splitter splitting incident local oscillator power between the power harvester and the parametric amplifier.

3. An upconverter according to claim 2, wherein the power splitter comprises one of a directional coupler and a Wilkinson coupler.

4. An upconverter according to claim 1, wherein the first port is an RF port.

5. An upconverter according to claim 4, wherein the first port receives signals in the frequency range 20 MHz to 500 MHz.

6. An upconverter according to claim 1, wherein the second port is a microwave port.

7. An upconverter according to claim 6, wherein the second port receives signals in the frequency range 1 GHz to 5 GHz.

8. An upconverter according to claim 1, wherein the two port parametric amplifier comprises a pair of varactor diodes connected between the first port and the second port; wherein the diodes are connected in parallel from the first port and in series from the second port; wherein the first port receives an input signal via the low noise amplifier; and wherein the second port receives an incident local oscillator signal and outputs an upconverted amplified input signal.

9. A wireless magnetic resonance imaging system, comprising:
    a magnetic resonance data acquisition unit having a bore therein;
    a local oscillator and transceiver array mounted in said bore; and
    a wireless local coil array and upconversion stage comprising a plurality of upconverters, each of said upconverters comprising a two port parametric amplifier, said amplifier comprising a first port to receive an input signal to be amplified and upconverted and a second port to receive a local oscillator signal and to output the amplified, upconverted signal at upper and lower sideband frequencies, an antenna coupled to the second port to receive the local oscillator signal and transmit the amplified, upconverted signal at upper and lower sideband frequencies, a low noise amplifier at the first port of the parametric amplifier, and a power harvester, said power harvester receiving local oscillator power and generates a DC bias voltage for the parametric amplifier and a supply for the low noise amplifier.

* * * * *